(12) United States Patent
Hoegerl et al.

(10) Patent No.: US 8,724,340 B2
(45) Date of Patent: May 13, 2014

(54) DATA CARRIER FOR CONTACTLESS DATA TRANSMISSION AND A METHOD FOR PRODUCING SUCH A DATA CARRIER

(75) Inventors: Juergen Hoegerl, Regensburg (DE); Martin Buchsbaum, Graz (AT); Frank Pueschner, Kelheim (DE); Stephan Rampetzreiter, Graz (AT)

(73) Assignee: Infineon Technologies AG, Neubiberg (DE)

( * ) Notice: Subject to any disclaimer, the term of this patent is extended or adjusted under 35 U.S.C. 154(b) by 204 days.

(21) Appl. No.: 13/440,156

(22) Filed: Apr. 5, 2012

(65) Prior Publication Data

US 2012/0188736 A1    Jul. 26, 2012

Related U.S. Application Data

(63) Continuation-in-part of application No. 12/556,404, filed on Sep. 9, 2009.

(30) Foreign Application Priority Data

Sep. 9, 2008 (DE) .......................... 10 2008 046 407

(51) Int. Cl.
*H05K 1/18* (2006.01)

(52) U.S. Cl.
USPC ........... 361/764; 361/737; 361/760; 361/763; 361/782

(58) Field of Classification Search
CPC .............. H05K 5/0265; H05K 5/0282; H05K 2201/0355; H05K 2201/0394
USPC ................. 361/736–737, 760–764, 782–784; 439/66–69; 235/488–492
See application file for complete search history.

(56) References Cited

U.S. PATENT DOCUMENTS

| | | |
|---|---|---|
| 6,181,287 B1 | 1/2001 | Beigel |
| 6,222,740 B1 | 4/2001 | Bovensiepen et al. |
| 6,319,827 B1 | 11/2001 | Kowalski et al. |
| 6,882,538 B1 | 4/2005 | Frisch |
| 7,047,624 B2 | 5/2006 | Vogt |

(Continued)

FOREIGN PATENT DOCUMENTS

| | | |
|---|---|---|
| DE | 20021698 U1 | 5/2001 |
| DE | 10200569 A1 | 5/2003 |

(Continued)

OTHER PUBLICATIONS

A. Ostamann et al. Strategies for Embedding of Active Components Microsystems, Packaging, Assembly Conference Taiwan; Oct. 18-20, 2006 pp. 1-4.

*Primary Examiner* — Tuan T Dinh

(57) ABSTRACT

Data carrier for contactless data transmission comprising a substrate, a chip having at least one connection pad, wherein the chip is arranged by its side remote from the connection pad on the substrate and a first copper-coated prepreg layer is arranged on the chip and at least partly on the substrate and has a contact opening to the connection pad. A plated-through hole is situated within the contact opening for producing an electrically conductive connection between the connection pad of the chip and the copper layer of the first copper-coated prepreg layer, wherein a first antenna structure is formed in the copper layer of the first copper-coated prepreg layer.

22 Claims, 5 Drawing Sheets

(56) References Cited

U.S. PATENT DOCUMENTS

| | | | |
|---|---|---|---|
| 7,154,758 B2 * | 12/2006 | Welling et al. | 361/764 |
| 7,229,022 B2 | 6/2007 | Rietzler | |
| 8,410,592 B2 | 4/2013 | Otremba et al. | |
| 2001/0055202 A1 * | 12/2001 | Templeton et al. | 361/761 |
| 2003/0085454 A1 | 5/2003 | Reutner et al. | |
| 2003/0148107 A1 | 8/2003 | Suzuki et al. | |

FOREIGN PATENT DOCUMENTS

| | | |
|---|---|---|
| DE | 19954941 A1 | 11/2003 |
| DE | 102006047761 A1 | 4/2008 |
| WO | 0137338 A2 | 5/2001 |

* cited by examiner

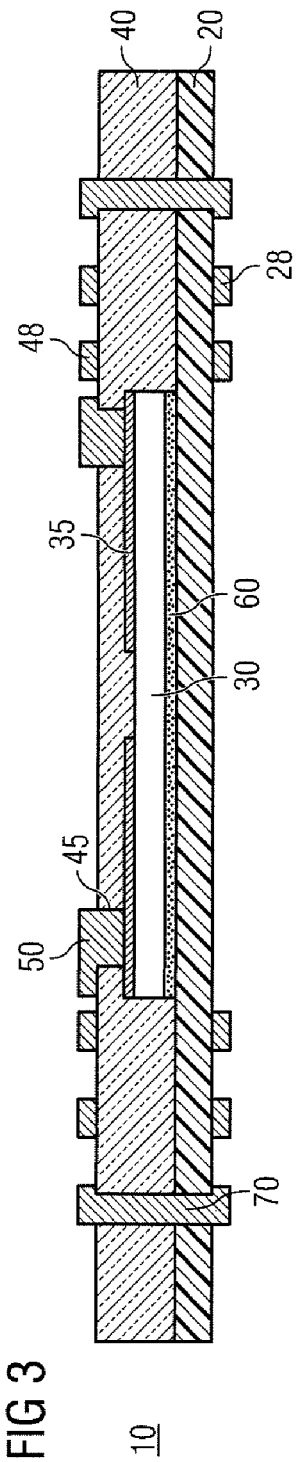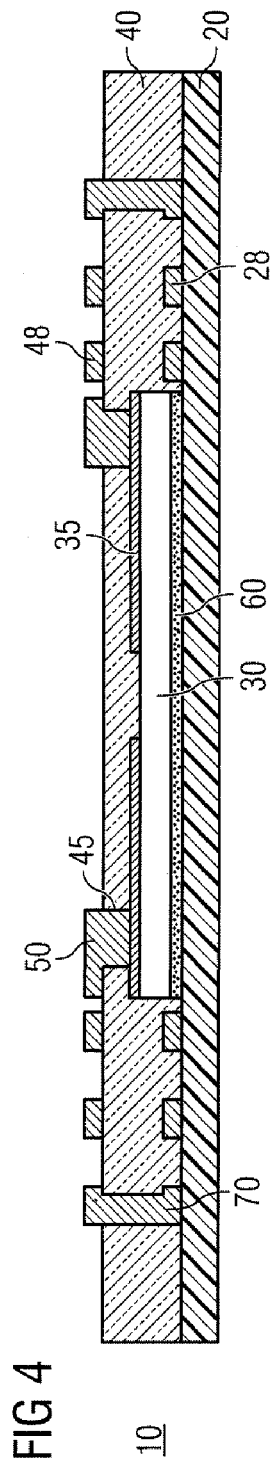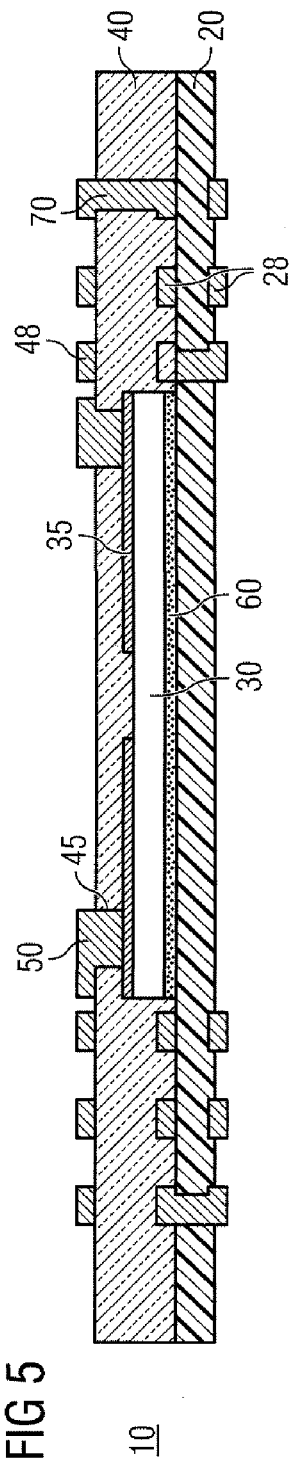

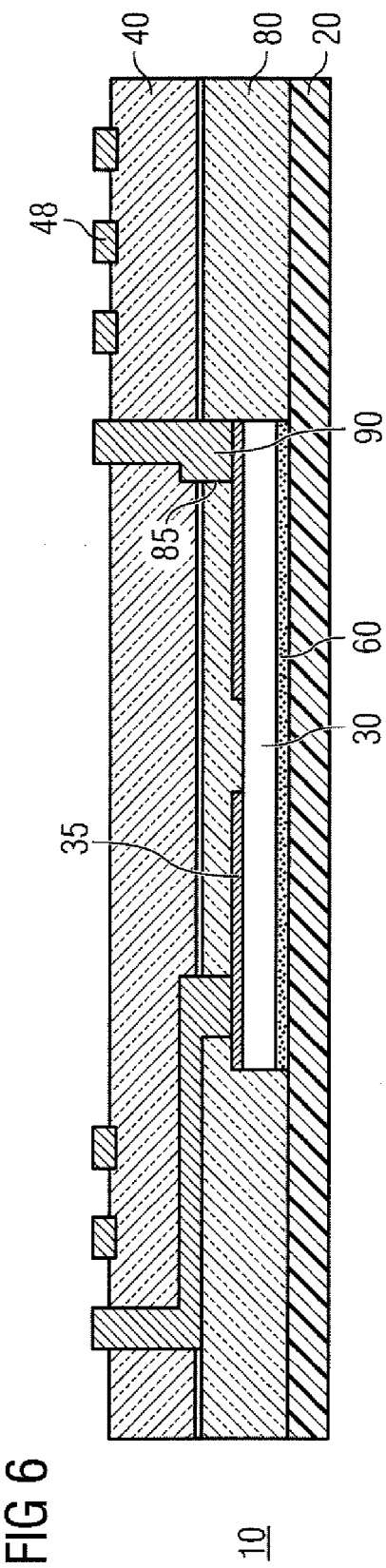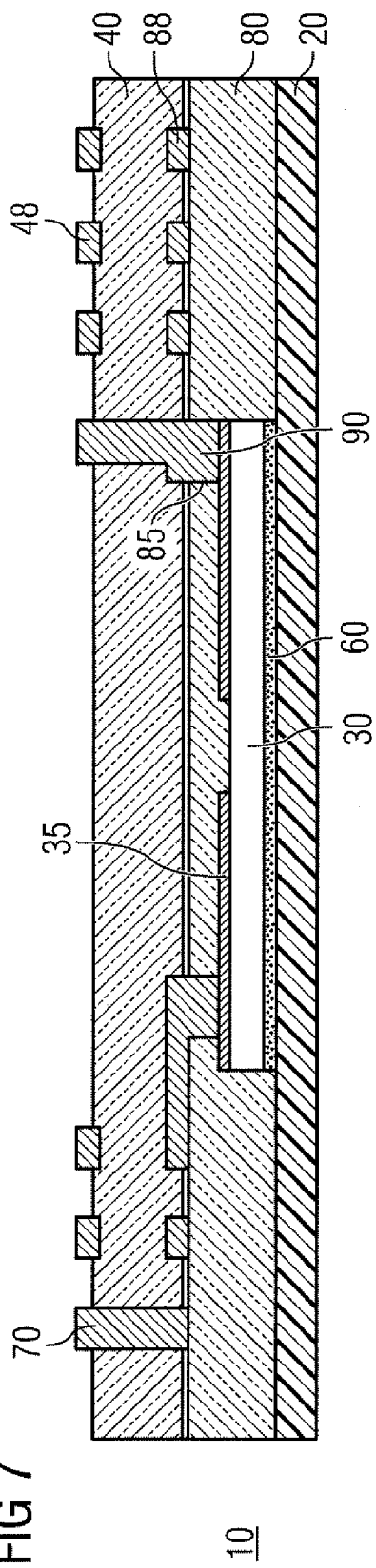

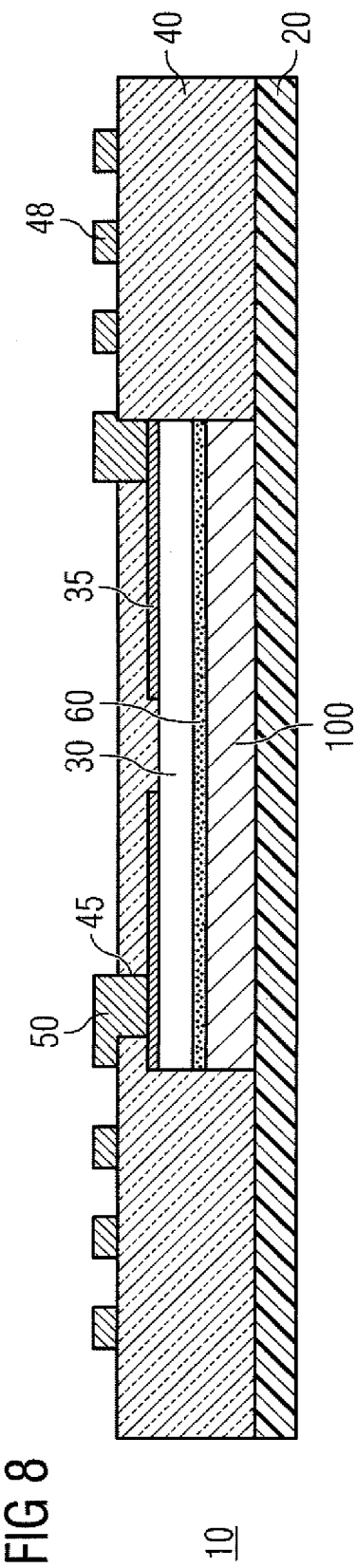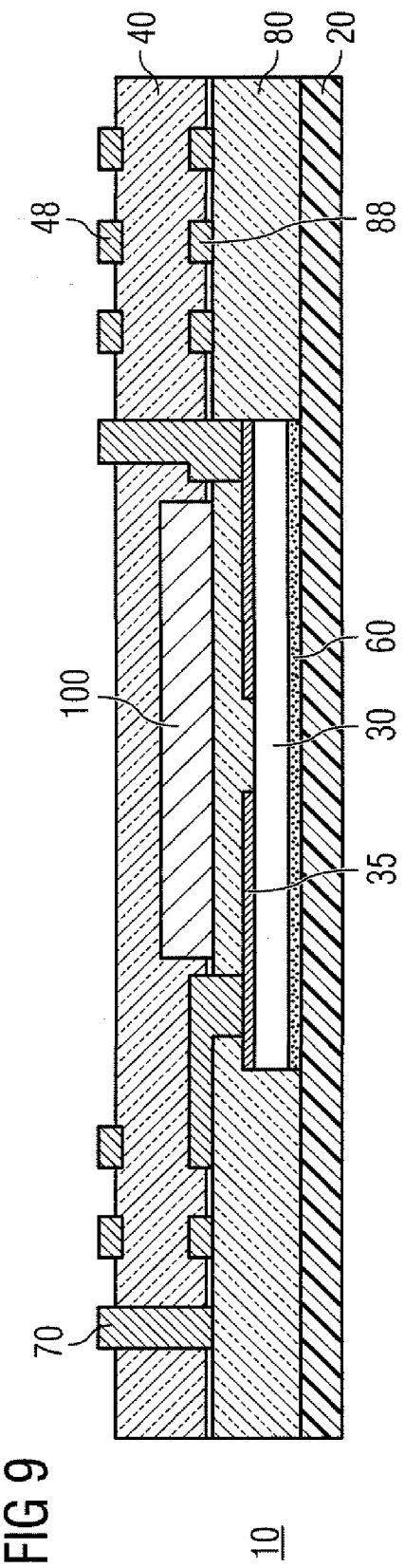

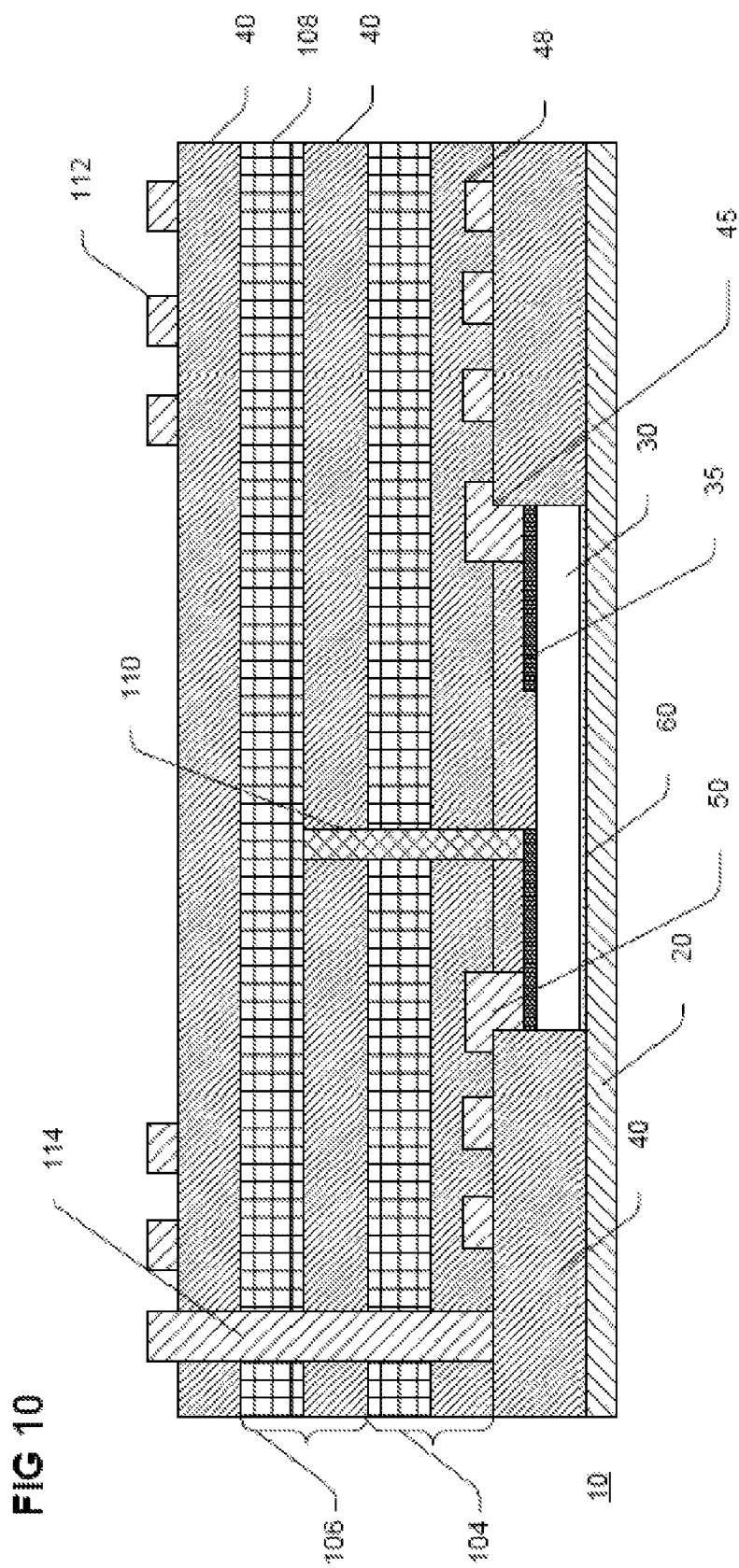

DATA CARRIER FOR CONTACTLESS DATA TRANSMISSION AND A METHOD FOR PRODUCING SUCH A DATA CARRIER

RELATED APPLICATIONS

This application is a Continuation in Part of co-pending U.S. patent application Ser. No. 12/556,404, which was filed on Sep. 9, 2009. The U.S. patent application Ser. No. 12/556,404 claims priority benefit of German Patent Application No. 102008046407.4, which was filed on Sep. 9, 2008. The entire contents of U.S. patent application Ser. No. 12/556,404 and the German Patent Application No. 102008046407.4 are hereby incorporated herein by reference.

BACKGROUND

Data carriers having integrated circuits are used for example in the form of credit cards, bank cards, cash payment cards and the like in a wide variety of service sectors, for example in cashless payment transactions, or in the field of personal identification as an identity card, an electronic passport, etc. In a large proportion of these data carriers, the power supply and/or the data exchange with external devices are effected with contact via the external contact areas of an electronic module. Since the contact areas for connecting the data carriers to a reading/writing device are exposed in the case of these data carriers, there is the risk of soiling of the contact areas, as a result of which erroneous data transmission between the data carrier and the relevant reading/writing device of the terminal can occur on account of poor contact-making. In order to avoid the disadvantages mentioned above, contactless data carriers, that is to say data carriers for contactless data exchange, e.g. by means of inductive coupling, have been developed.

In particular on account of the constantly increasing demand for contactlessly readable documents for personal identification, such as the electronic passport, especially thin, robust data carriers that can be produced cost-effectively are required for contactless applications.

DE 102 00 569 A1 discloses a smart card comprising a multiplicity of card layers which lie one on top of another and are connected to one another by heat and pressure. An inner carrier layer has an antenna coil with a plurality of conductor tracks and coil pads arranged at the ends and a cutout for receiving a chip module. The coil pads are arranged in a contact-making region on both sides of a conductor track section formed by conductor tracks running alongside one another.

As a result of the direct contact-connection of the chip connections of the chip module to the coil pads of the antenna coil, although overall a relatively flat construction of the smart card is achieved, the production of such a smart card with its three-layered construction is complicated and cost-intensive.

SUMMARY

An implementation described herein provides a data carrier having contactless coupling that can be produced simply and cost-effectively.

In one particular implementation, a data carrier for contactless data transmission includes a substrate, a chip having at least one connection pad, wherein the chip is arranged by its side remote from the connection pad on the substrate, a first copper-coated prepreg layer, wherein the first copper-coated prepreg layer is arranged on the chip and at least partly on the substrate and has a contact opening to the connection pad, and a plated-through hole within the contact opening for producing an electrically conductive connection between the connection pad of the chip and the copper layer of the first copper-coated prepreg layer, wherein a first antenna structure is formed in the copper layer of the first copper-coated prepreg layer.

Furthermore, a data carrier according to a described implementation may include a chip having at least one connection pad, wherein the chip is arranged on a substrate by its side remote from the connection pad, that is to say the rear side. In this case, the chip can be thinned or unthinned or be situated in a housing, for example. Furthermore, the chip can be fixed on the substrate by means of a suitable adhesive. A copper-coated prepreg layer is arranged on the chip and at least partly on the substrate. The copper-coated prepreg layer has contact openings above the connection pads of the chips. A plated-through hole situated within the contact opening serves for producing an electrically conductive connection between the connection pad of the chip and the copper layer of the copper-coated prepreg layer. An antenna structure, which can be produced by etching methods, for example, is formed into the copper layer of the copper-coated prepreg layer.

The data carrier constructed in two-stage fashion can be produced simply and cost-effectively. This is achieved by the use of a copper-coated prepreg layer having an antenna structure.

In another particular implementation, a method for producing a data carrier for contactless data transmission may include arranging a chip having at least one connection pad on a substrate, wherein that side of the chip which is remote from the connection pad is connected to the substrate, laminating a first copper-coated prepreg layer on the chip and at least partly on the substrate, introducing a contact opening above the connection pad of the chip into the copper-coated prepreg layer, producing a plated-through hole between the connection pad of the chip and the copper layer of the copper-coated prepreg layer, and forming an antenna structure in the copper layer of the copper-coated prepreg layer.

The antenna structure can be introduced or formed for example at the end of the production process. The antenna structure is formed e.g. by way of an etching method. Furthermore, the antenna structure can alternatively be formed before the copper-coated prepreg layer is laminated therein. In principle, the copper-coated prepreg layer can be structured before the production of the data carrier, that is to say that prestructured copper-coated prepreg layers can be used, which are then arranged appropriately on the chip. By way of example, antenna structures and electrical components can be prestructured into the copper layer and holes or perforations can be prestructured into the entire copper-coated prepreg layer.

In order to produce the plated-through hole, for example the wall of the hole can be chemically activated and a chemical or chemical-electrolytic copper deposition can subsequently be performed. This copper deposition then brings about an electrical connection between the connection pads of the chip and the copper-coated prepreg layer.

In a further exemplary implementation, the antenna structure of the data carrier may be in the form of a coil.

In order to obtain a better stability of the data carrier, a stiffening element may be arranged between the chip and the substrate. By way of example, the stiffening element is composed of metal.

In a further exemplary implementation, the data carrier has, alongside the antenna structure, a further, second antenna structure, which is likewise coupled to the chip. In order to increase their inductance, the two antenna structures can be connected in series. The second antenna structure can be for example a wire coil having at least one turn. The second antenna structure can alternatively be formed directly on the substrate if the substrate is a copper-coated printed circuit board, for example. Examples of suitable printed circuit boards are epoxy resin coated copper, CuSn6 (also with refined surface, for example Ag, Sn) resin coated copper or FR4 resin coated copper printed circuit boards. The second antenna structure can be arranged on that side of the substrate which faces the chip, on that side of the substrate which is remote from the chip, or on both sides of the substrate. If the second antenna structure is arranged on both sides of the substrate, then the individual parts of the antenna structure can be connected by way of vias.

Alongside the second antenna structure, any desired electrical components, for example capacitors, may also be arranged on the substrate.

The coupling of the chip to the second antenna structure may be effected by way of an inductive coupling of the two antenna structures or by means of a direct electrically conductive connection between either the antenna structures or the second antenna structure to the chip directly.

In yet another exemplary implementation, the data carrier may also have one or more interlayers and/or covering layers.

The interlayer can be arranged for example between the substrate with arranged chip and the copper-coated prepreg layer. In this case, the interlayer can have a contact opening for a plated-through hole for producing an electrically conductive connection between the connection pad of the chip and the copper layer of the copper-coated prepreg layer.

In yet another exemplary implementation, the interlayer may have a further, third antenna structure. In this case, the interlayer can be a simple prepreg layer or a further, second copper-coated prepreg layer.

The data carrier according to various implementations may be inserted for example into a smart card, a dual interface card or into a document for personal identification, for example an electronic passport.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

FIG. 3 shows a further exemplary implementation of the data carrier in cross section, wherein the data carrier has a second antenna structure.

FIG. 4 shows a further exemplary implementation of the data carrier in cross section, wherein the data carrier has a second antenna structure.

FIG. 5 shows a further exemplary implementation of the data carrier in cross section, wherein the data carrier has a second antenna structure.

FIG. 6 shows a further exemplary implementation of the data carrier in cross section, wherein the data carrier has an interlayer.

FIG. 7 shows a further exemplary implementation of the data carrier in cross section, wherein the data carrier has an interlayer.

FIG. 8 shows a further exemplary implementation of the data carrier in cross section, wherein the data carrier has a stiffening element.

FIG. 9 shows a further exemplary implementation of the data carrier in cross section, wherein the data carrier has a stiffening element.

FIG. 10 shows a further exemplary implementation of the data carrier in cross section, wherein the data carrier includes at least an additional layer that includes a capacitor plate, capacitor or capacitance.

DETAILED DESCRIPTION

Figure 1:
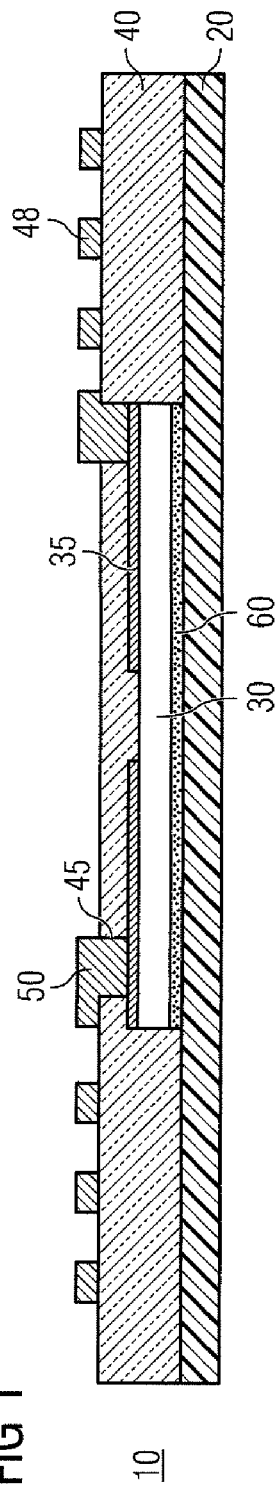
FIG. 1 shows a first exemplary implementation of the data carrier in cross section.

FIG. 1 shows an exemplary implementation of the data carrier 10 in cross section. A chip is fixed on a substrate 20 by means of an adhesive layer 60. The chip 30 has two connection pads 35 and is arranged by its rear side remote from the connection pads 35 on the substrate 20. A copper-coated prepreg layer 40 is arranged above the chip 30 and the substrate 20. Copper-coated prepreg layers are also referred to as RCC foil or resin coated copper foil. In the copper-coated prepreg layer 40, two plated-through holes 50 are situated above the connection pads 35. The two plated-through holes 50 are situated in a contact opening 45 in each case. By way of example, the contact opening can be introduced into the copper-coated prepreg layer by means of laser drilling. The two plated-through holes 50 serve for producing an electrically conductive connection between the connection pads 35 of the chip 30 and the copper layer of the copper-coated prepreg layer 40. An antenna structure 48 is formed in the copper layer of the copper-coated prepreg layer 40. In this exemplary implementation, the antenna structure 48 comprises a coil having a plurality of turns.

Figure 2:
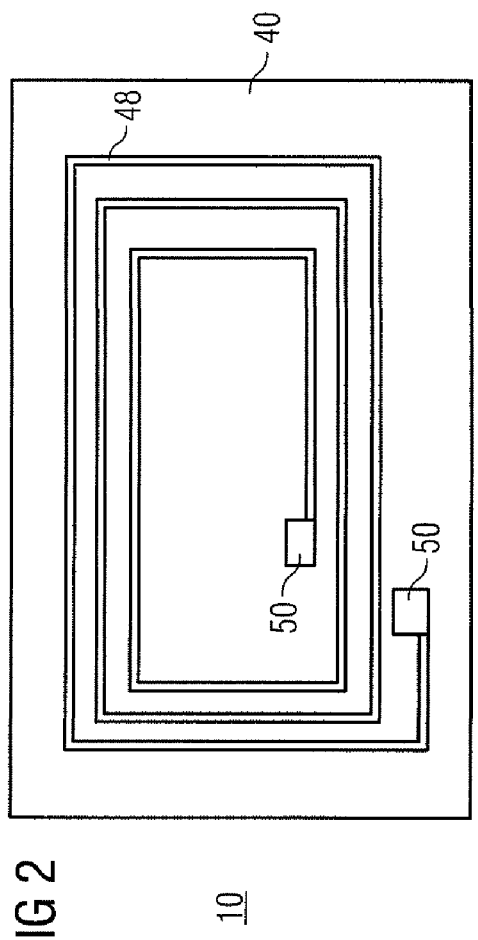
FIG. 2 shows a plan view of an exemplary implementation of the data carrier.

FIG. 2 shows a plan view of an exemplary implementation of the data carrier 10. In this exemplary implementation, a coil-type antenna structure 48 is formed on the copper-coated prepreg layer 40. At the end of the antenna structure 48, in each case a plated-through hole 50 to the connection pads of the chip 35 (not illustrated here) is formed.

FIG. 3 shows a further exemplary implementation of the data carrier 10 in cross section, wherein the data carrier has a second antenna structure. In addition to the exemplary implementation shown in FIG. 1, this exemplary implementation has a second antenna structure 28 on that side of the substrate 20 which is remote from the chip 30. The substrate 20 can be for example a copper-coated printed circuit board on which corresponding antenna structures 28 have been formed. The second antenna structure 28 is electrically conductively connected to the first antenna structure 48 by means of a plated-through hole 70. The first antenna structure 48 is connected to the two connection pads 35 of the chip 30 by means of the plated-through holes 50.

FIG. 4 shows a further exemplary implementation of the data carrier 10 in cross section, wherein the data carrier likewise has a second antenna structure. In contrast to the exemplary implementation shown in FIG. 3, here the second antenna structure 28 is situated on that side of the substrate 20 which faces the chip 30. In this exemplary implementation too, the first antenna structure 48 and the second antenna structure 28 are electrically conductively connected by means of a plated-through hole 70. There is also an electrically conductive connection between the first antenna structure 48 and the connection pads 35 of the chip 30 by means of a plated-through hole 50.

FIG. 5 shows a further exemplary implementation of the data carrier 10 in cross section, wherein the data carrier has a second antenna structure. In this exemplary implementation, the second antenna structure 28 extends onto the top side and underside of the substrate 20. The two parts of the second antenna structure 28 are electrically conductively connected to one another by means of a plated-through hole 29. In this exemplary implementation, too, the second antenna structure 28 is electrically conductively connected to the first antenna structure 48 by means of a plated-through hole 70. The first antenna structure 48 is electrically conductively connected to the connection pads 35 of the chip by means of the plated-through holes 50.

FIG. 6 shows a further exemplary implementation of the data carrier 10 in cross section, wherein the data carrier has an interlayer 80. The interlayer 80 is situated between the substrate 20 with applied chip 30 and the copper-coated prepreg layer 40. In the exemplary implementation shown, the interlayer 80 is likewise a copper-coated prepreg layer. A conductor structure 82 is formed in the copper layer of the copper-coated prepreg layer of the interlayer 80. Alongside the contact openings 85 and the plated-through hole 90, said conductor structure 82 is part of an electrically conductive connection between the connection pads 35 of the chip 30 and the antenna structure 48.

FIG. 7 shows a further exemplary implementation of the data carrier 10 in cross section, wherein the data carrier has an interlayer 80. In comparison with the exemplary implementation shown in FIG. 6, this exemplary implementation has an interlayer 80 with a further antenna structure 88. The antenna structure 88 is structured into the copper layer of the copper-coated prepreg layer of the interlayer 80 before the application of the copper-coated prepreg layer 40. In this exemplary implementation, the antenna structure 88 is a coil having a plurality of turns. The antenna structure 88 and the antenna structure 48 are electrically conductively connected by means of the plated-through holes 70 and 90.

FIG. 8 shows a further exemplary implementation of the data carrier 10 in cross section, wherein the data carrier 10 has a stiffening element 100. The stiffening element 100 is arranged between the substrate 20 and the chip 30. The chip 30 and the stiffening element 100 are connected to one another by means of an adhesive layer 60. As in the exemplary implementation in FIG. 1, an electrically conductive connection is achieved between the connection pads 35 of the chip 30 and the antenna structure 48 by means of plated-through holes 50, situated in contact openings 45.

FIG. 9 shows a further exemplary implementation of the data carrier 10 in cross section, wherein the data carrier has a stiffening element 100. In this exemplary implementation, the data carrier 10 has not only a stiffening element but also an additional interlayer 80. The stiffening element 100 is situated in between the copper-coated prepreg layer 40 and the interlayer 80. In this exemplary implementation, the interlayer 80 is likewise a copper-coated prepreg layer with antenna structure 88 similar to the exemplary implementation in FIG. 7.

FIG. 10 shows a further exemplary implementation of the data carrier 10 in cross section, wherein the data carrier 10 includes at least an additional layer (e.g., prepreg layer) that includes a capacitor plate, capacitor or capacitance. A chip 30 is fixed on a substrate 20 by way of an adhesive layer 60. The chip 30 has two connection pads 35. A copper-coated prepreg layer 40 is arranged over (or under depending on orientation) the chip 30 and the substrate 20. The use of 'over' herein may also represent 'under' depending on orientation of a referenced object. A copper-coated prepreg layer 40 is arranged over the chip 30 and the substrate 20. Copper-coated prepreg layers are also referred to as RCC foil or resin coated copper foil. In the copper-coated prepreg layer 40, two plated-through holes 50 are situated over the connection pads 35. The two plated-through holes 50 are situated in a contact opening 45 in each case. By way of example, the contact opening can be introduced into the copper-coated prepreg layer 40 by way of laser drilling. The two plated-through holes 50 serve for producing an electrically conductive connection between the connection pads 35 of the chip 30 and the copper layer of the copper-coated prepreg layer 40. An antenna structure 48 is formed in the copper layer of the copper-coated prepreg layer 40. In this exemplary implementation, the antenna structure 48 comprises a coil having a plurality of turns.

FIG. 10 further illustrates the use of two additional layers 104 and 106 positioned over the chip 30 and the antenna structure 48. Each of the layers 104 and 106 may include a prepreg layer 40 and a capacitor plate 108, capacitor, or capacitance. Two additional layers 104 must not be used. Rather, a single layer 104 may be used. In addition, one or more of the layers 104 and/or 106 may be rotated 180 degrees, such that the positioning of the prepreg layer 40 and the capacitance 108 are opposite to that which is illustrated. Moreover, such a layer 104 and/or 106 may be used with other embodiments of this disclosure.

The layers 104 and 106 may be coupled to the chip 30 by way of one or more conductively filled through holes 110. In one implementation, one or more of the layers 104 and 106 is fabricated from a metal coated resin, such as FR4 resin coated copper printed circuit boards, where the metal is applied over the FR4 resin. In another implementation, one or more of the layers 104 and 106 is fabricated to include at least a dielectric layer and a metal layer. In one or more implementations, one or more the layers 104 and 106 is fabricated to include a dielectric layer with a metal layer at least partially structured or embedded in the dielectric layer.

FIG. 10 further illustrates an additional layer 40 with a further antenna structure 112. The antenna structure 112 is structured into the copper layer of the copper-coated prepreg layer of the additional layer 40. In this exemplary implementation, the antenna structure 112 is a coil having a plurality of turns. The antenna structure 112 and the antenna structure 48 are electrically conductively connected by at least one or more plated-through hole 114.

The use of one or more of the layers 104 and 106, which have capacitive attributes, may enhance the capacity of the antenna structures disclosed herein, thereby removing the need to use an external antenna if additional antenna capacity is required. Moreover, the one or more layers 104 and 106 may structurally enhance the data carrier structures disclosed herein, such that various layers of the structures may be reduced and/or stiffening elements reduced in size or even eliminated.

The invention claimed is:

1. A data carrier for contactless data transmission, comprising:
   a substrate;
   a chip having at least one connection pad, the chip being arranged over the substrate;
   a first copper-coated prepreg layer, the first copper-coated prepreg layer being arranged over the chip and the substrate and having a contact opening to the connection pad;
   a plated-through hole within the contact opening for producing an electrically conductive connection between the connection pad of the chip and the copper layer of the first copper-coated prepreg layer, wherein a first antenna structure is formed in the copper layer of the first copper-coated prepreg layer; and a first capacitive structure formed over the first copper-coated prepreg layer, the first capacitive structure electrically coupled to the chip.

2. The data carrier as claimed in claim 1, wherein the first antenna structure is formed in the form of a coil having at least one turn.

3. The data carrier as claimed in claim 1, wherein a stiffening element is arranged between substrate and chip.

4. The data carrier as claimed in claim 3, wherein the stiffening element is composed of metal.

5. The data carrier as claimed in claim 1, wherein the data carrier has a second antenna structure and the latter is coupled to the chip.

6. The data carrier as claimed in claim 5, wherein the second antenna structure is a wire coil having at least one turn.

7. The data carrier as claimed in claim 5, wherein the second antenna structure is formed in a copper layer applied on the substrate.

8. The data carrier as claimed in claim 7, wherein the second antenna structure is formed in the form of a coil having at least one turn.

9. The data carrier as claimed in claim 5, wherein the second antenna structure is arranged on that side of the substrate which faces the chip.

10. The data carrier as claimed in claim 5, wherein the second antenna structure is arranged on that side of the substrate which is remote from the chip.

11. The data carrier as claimed in claim 5, wherein the second antenna structure is arranged on that side of the substrate which faces the chip and on that side of the substrate which is remote from the chip.

12. The data carrier as claimed in claim 5, wherein the chip is inductively coupled to the second antenna structure by means of the first antenna structure.

13. The data carrier as claimed in claim 5, wherein the chip is coupled to the second antenna structure by means of an electrically conductive connection.

14. The data carrier as claimed in claim 1, further comprising a second capacitive structure formed over the second capacitive structure, the second capacitive structure electrically coupled to the chip.

15. The data carrier as claimed in claim 1, further comprising an interlayer, wherein the interlayer is arranged between the substrate with arranged chip and the first copper-coated prepreg layer, wherein the interlayer has a contact opening for a plated-through hole for producing an electrically conductive connection between the connection pad of the chip and the copper layer of the first copper-coated prepreg layer.

16. The data carrier as claimed in claim 1, wherein the first capacitive structure comprises a prepreg layer and a capacitor plate.

17. The data carrier as claimed in claim 15, wherein the interlayer is a prepreg layer.

18. The data carrier as claimed in claim 15, wherein the interlayer is a second copper-coated prepreg layer.

19. A method for producing a data carrier for contactless data transmission, comprising:
arranging a chip having at least one connection pad on a substrate;
laminating a first copper-coated prepreg layer over the chip and at least partly over the substrate;
introducing a contact opening above the connection pad into the first copper-coated prepreg layer;
producing a plated-through hole between the connection pad of the chip and the copper layer of the first copper-coated prepreg layer;
forming a first antenna structure in the copper layer of the first copper-coated prepreg layer; and
forming a first capacitive structure over the first copper-coated prepreg layer, the first capacitive structure electrically coupled to the chip.

20. The method for producing a data carrier as claimed in claim 19, wherein the process of forming the first antenna structure in the copper layer of the first copper-coated prepreg layer takes place before the process of laminating the first copper-coated prepreg layer.

21. The method for producing a data carrier as claimed in claim 19, wherein the process of forming the first antenna structure in the copper layer of the first copper-coated prepreg layer takes place after the process of laminating the first copper-coated prepreg layer.

22. The method for producing a data carrier as claimed in claim 19, wherein the substrate has a copper layer and the copper layer is structured before the chip is applied.

* * * * *